(12) United States Patent
Eschauzier

(10) Patent No.: US 6,294,958 B1
(45) Date of Patent: Sep. 25, 2001

(54) APPARATUS AND METHOD FOR A CLASS AB OUTPUT STAGE HAVING A STABLE QUIESCENT CURRENT AND IMPROVED CROSS OVER BEHAVIOR

(75) Inventor: Rudolphe Gustave Hubertus Eschauzier, Bergschenhoek (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/703,475

(22) Filed: Oct. 31, 2000

(51) Int. Cl.$^7$ ........................................... H03F 3/26
(52) U.S. Cl. ............................. 330/267; 330/268
(58) Field of Search ................................. 330/255, 267, 330/268

(56) References Cited

U.S. PATENT DOCUMENTS 4,560,946 * 12/1985 Yokoyama ........................ 330/149
5,754,078 * 5/1998 Tamagawa ......................... 330/255
6,163,216 * 12/2000 Murray et al. ..................... 330/255

OTHER PUBLICATIONS

"160 MHz Rail–to–Rail Amplifier With Disable", DataSheet AD8041, Analog Devices, Inc., 1995.
D.M. Monticelli, "A Quad CMOS Single–Supply Op Amp With Rail–to–Rail Output Swing", *IEEE Journal of Solid–State Circuits*, vol. SC–21, No. 6, pp. 1026–1034, Dec. 1986.

* cited by examiner

Primary Examiner—Robert Pascal
Assistant Examiner—Henry Choe
(74) Attorney, Agent, or Firm—Merchant & Gould P.C.; John W. Branch

(57) ABSTRACT

An electronic circuit for a Class AB output stage that has a differential input and a single ended output. A pair of clamp transistors are coupled between the bases of a pair of output transistors so that cross-over distortion is reduced and the output transistors do not completely turn off. A floating current source is employed to provide a stable quiescent current over a range of supply voltages. Also, the types and sizes of the transistors in the floating current source and the clamp transistors are matched so that any non-linear change in the operation of the clamp transistors caused by the Early effect over a range of supply voltages is automatically compensated for.

20 Claims, 4 Drawing Sheets

US 6,294,958 B1

APPARATUS AND METHOD FOR A CLASS AB OUTPUT STAGE HAVING A STABLE QUIESCENT CURRENT AND IMPROVED CROSS OVER BEHAVIOR

BACKGROUND OF THE INVENTION

An integrated amplifier circuit such as an opamp is usually constructed from a small chip of semiconductor material upon which an array of active/passive components have been constructed and connected together to form a functioning circuit. An integrated amplifier circuit is generally encapsulated in a plastic housing (chip) with signal, power supply, and control pins accessible for connection to external electronic circuitry. Typically, input signals transmitted to the integrated amplifier circuit via selected input pins are processed by active and passive components in different stages, e.g., input and turn-around, and the processed signals are then applied to selected output pins using an output stage.

The enormous growth of high-speed communication and high data rate image processing applications, requiring high-speed, low power and small size, has created a demand for miniaturized high-speed amplifiers that can operate at low voltages. To maximize the dynamic range at low supply voltages for this use, it is desirable that the output voltage range for this type of amplifier should be as large as possible. Preferably, the output voltage range of the amplifier would extend from one rail to the other rail of the power supply.

Class-AB circuitry is used in amplifiers that employ both bipolar and MOS components. A Class AB circuit can deliver to and pull from a load a current that is larger than the DC quiescent current flowing into the circuit. For example, the drive current in a Class AB circuit may be 100 milliamps and the quiescent current could be 1 milliamp. Class AB circuitry is preferred in output stage of a low-power high speed amplifier because it improves power efficiency by maximizing the output drive current with a relatively low quiescent current. Also, class-AB circuitry enables the output stage to exhibit good linearity over the entire output voltage range.

However, class-AB circuitry can be prone to cross-over distortion caused by the non-linear operation of transistors in a push-pull amplifier. For example, when changing (crossing over) the active operation of one transistor (turn off) to another transistor (turn on) in an output stage, distortion of the output signal can be caused by a less than ideal (non-linear) operation of a transistor. In FIG. 1, a graph illustrates the effects of crossover distortion in an output signal.

To minimize power consumption when a low-power high-speed amplifier is operated at higher supply voltages, the quiescent current of the amplifier's output stage should remain constant when the supply voltage increases from a minimum to a maximum predetermined voltage. However, stabilization of this quiescent current over a range of supply voltages for an amplifier circuit typically requires some type of compensation for the Early effect (second order effect) which can cause increased quiescent current at elevated supply voltages. Typically, as the physical size of the base width of a transistor is decreased so will the Early voltage, which causes the collector current to increase as collector emitter voltage increases.

FIG. 2 illustrates a graph of the effect of the Early voltage on the operation of a transistor. The x-axis represents values for a collector emitter voltage and the y-axis represents a collector current. Two different Early voltages $V_{A1}$ and $V_{A2}$ are indicated on the x-axis at 100 volts and 20 volts, respectively. When the Early voltage has a value of 100 volts ($V_{A1}$), the collector current does not significantly increase as the collector emitter voltage increases. Alternatively, when the base width is significantly decreased and the Early voltage is decreased to 20 volts ($V_{A2}$), the collector current increases steeply as the collector emitter voltage increases.

Compensation for the Early effect has often been provided by physically matching sizes of NPN and PNP bipolar transistors in an integrated circuit. However, matching the sizes of bipolar transistors of different polarities is a process dependent technique that can be relatively imprecise in a highly miniaturized integrated circuit.

SUMMARY OF THE INVENTION

In accordance with the invention, an apparatus for an output stage of bipolar transistors that includes a pair of buffers that are coupled opposite ends of a resistor and a pair of input terminals that are adapted to receive a differential signal. A pair of output transistors are separately coupled between different sides of a supply voltage and a single ended output terminal. Each output transistor is a different type and separately turns in response to a polarity of the differential signal. A pair of clamp transistors have different types and they are separately associated with one of the output transistors that have the same type. Each clamp transistor clamps the turn off voltage to a predetermined value at a base of each associated output transistor. Also, a collector and an emitter for each clamp transistor is coupled between the bases of each output transistor. Additionally, a pair of source transistors that are different types are coupled between a pair of current mirrors that are separately coupled to opposite sides of the supply voltage and each buffer. The arrangement of the pair of source transistors enables a floating current source for turning on each current mirror to mirror a current on top of the current flowing through the resistor in response to a polarity of the differential signal. The size of each source transistor is matched to the size of each clamp transistor of the same type so that Early effect of the clamp transistors over a range of supply voltages is compensated for.

In accordance with another aspect of the invention, a pair of voltage sources are separately coupled to a base of each source transistor and separately coupled to separate sides of the supply voltage. Also, another pair of voltage sources are separately coupled to a base of each clamp transistor and separately coupled to a side of the supply voltage that is coupled to an emitter of the associated output transistor. Each voltage source may include two stacked diodes that are biased at a fixed current to match the base-emitter voltages of the associated clamp transistor and output transistors.

In accordance with yet another aspect of the invention, a coupling of a collector and an emitter for each clamp transistor between the bases of each output transistor causes a reduction in the cross over distortion of an output signal at the single ended output terminal. The floating current source provides a quiescent current that is stable over a range of supply voltages. Additionally, when the polarity of the differential signal turns on an output transistor, the other output transistor is kept from turning off. Similarly, when another polarity of the differential signal turns on the other output transistor, the output transistor is kept from turning off.

In accordance with still another aspect of the invention, a base for each clamp transistor is coupled to a separate voltage source. This separate voltage source is coupled to a side of the supply voltage that is coupled to the emitter of the associated output transistor. Also, each current mirror is coupled to an opposite side of the supply voltage.

In accordance with another aspect of the invention, the output stage may be employed with an amplifier and a comparator. Also, the output stage provides Class AB operation. Additionally, the types of the transistors include NPN and PNP.

The invention may also be implemented as methods that perform substantially the same functionality as the embodiments of the invention discussed above and below.

These and other features as well as advantages, which characterize the invention, will be apparent from a reading of the following detailed description and a review of the associated drawings.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

The invention provides for a low-power, low distortion Class AB output stage with a stable quiescent current over a wide range of supply voltages. The output stage reuses current employed to turn off an output transistor to drive on an opposing output transistor so that cross-over distortion is improved and power consumption is reduced. Furthermore, the clamp transistors prevent either output transistor from turning off completely. Also, the output stage employs a floating current source to provide a stable quiescent current and prevent increases in the quiescent current at higher voltages. Each of the floating current source transistors are physically matched to the same type of clamp transistor and the biasing of the source and clamp transistors is matched. This transistor and bias matching enables the floating current source to compensate for the Early effect over a range of supply voltages such as 2.7 to 10 volts, but not limited to.

Figure 1:
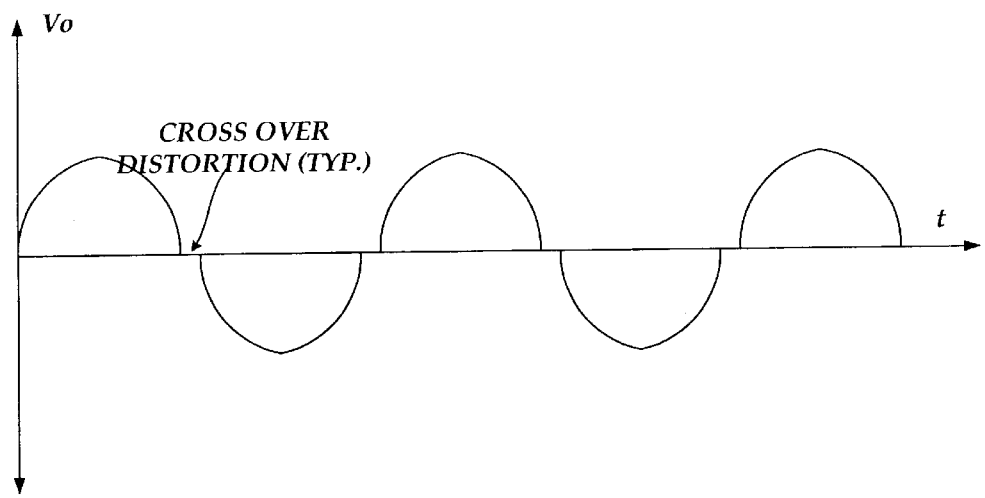
FIG. 1 illustrates a graph of cross-over distortion in an output signal.
Figure 2:
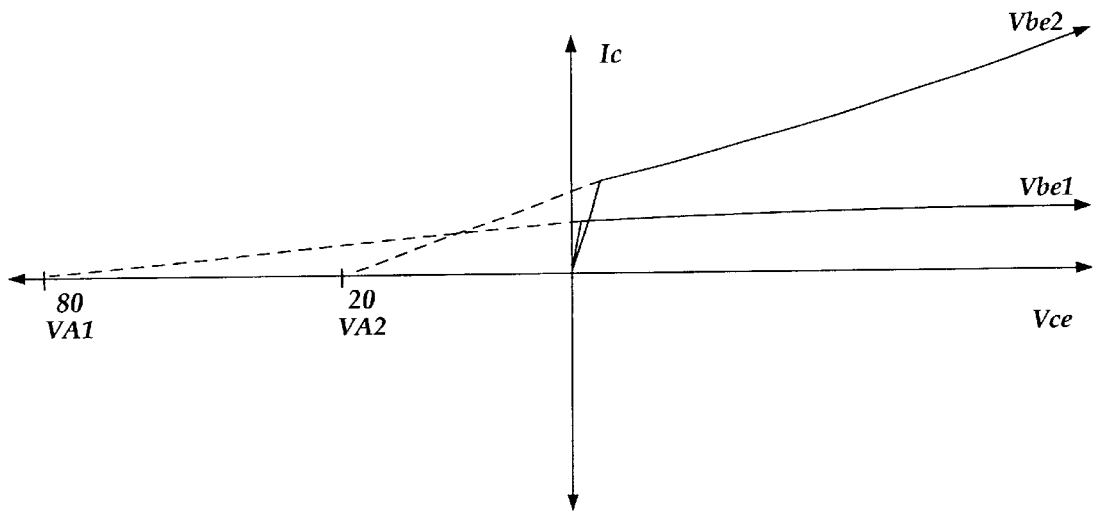
FIG. 2 shows a graph of the Early effect on the operation of a bipolar transistor.
Figure 3:
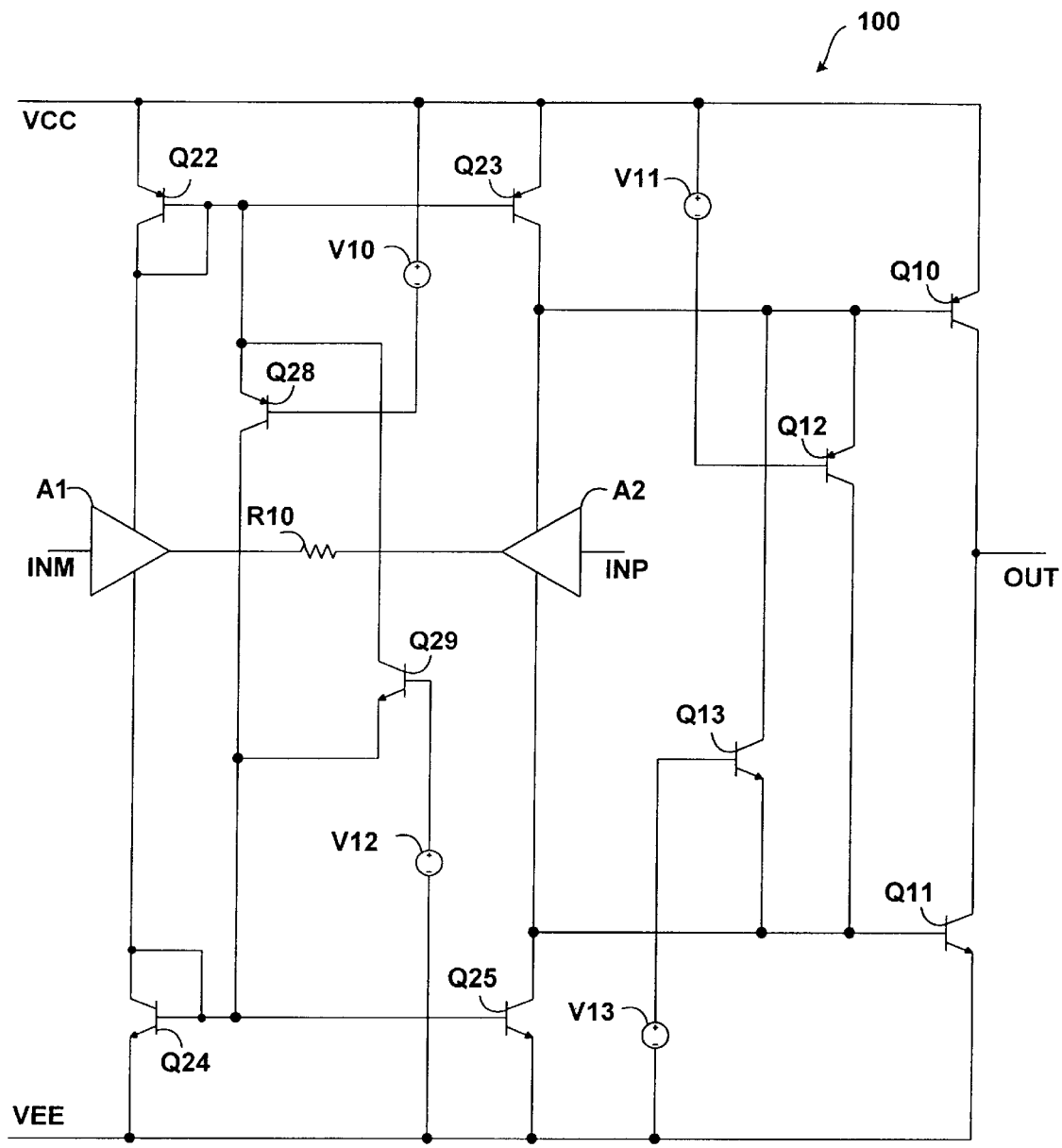
FIG. 3 illustrates a schematic diagram of one embodiment of the invention for a Class AB bipolar output stage that has a stable quiescent current and improved cross-over distortion over a range of supply voltages.

FIG. 3 illustrates a schematic diagram of one embodiment for an output stage circuit 100. At the input terminals INM and INP, a differential input signal is received from an input stage or another application. The first configuration may be preferred in applications requiring high open-loop gain. After processing of the differential input signal by the output stage, an output signal is provided at a single output terminal OUT.

A differential voltage signal across the input terminals INM and INP are separately buffered at the respective inputs by two separate unity gain input buffers A1 and A2 whose outputs are coupled to opposite ends of an input resistor R10. When there is a differential voltage across the input resistor R10, a base drive current is generated, depending on the polarity of the differential input signal, for either a push PNP bipolar transistor Q10 or a pull NPN bipolar transistor all coupled to the output terminal OUT.

For example, when the voltage at the input terminal INP is positive with respect to the voltage at the input terminal INM, a current flows from the output of input buffer A2, through resistor R10 and into the output of the input buffer A1. This current includes a current that flows from the positive supply terminal of the input buffer A2 and another current that flows from the negative supply terminal of the input buffer A1. Since the positive supply terminal of input buffer A2 is directly connected to the base of the push PNP output transistor Q10 and the current mirror Q22 and Q23, the current flowing into this positive supply terminal will cause a drive current to flow to the base of transistor Q10, which is turned on.

Additionally, the current contributed by the negative supply terminal of the input buffer A1 is mirrored by the current mirror transistors Q24 and Q25. When transistor Q25 conducts, it pulls the base of pull NPN output transistor Q11 low, which turns the transistor Q11 off. However, to prevent the base of the output transistor Q11 from being pulled all the way to ground (turned off completely) a voltage clamp NPN transistor Q13 turns on and clamps the base voltage of transistor Q11 at a voltage level that is a predetermined value above the VEE voltage (ground).

Alternatively, when the differential input signal reverses polarity, the current flowing through resistor R10 moves in the opposite direction so that the pull NPN output transistor Q11 is turned on and the push PNP output transistor Q10 is turned off. To prevent the push PNP transistor Q10 from being completely turned off, a voltage clamp PNP transistor Q12 turns on and clamps the Q10 transistor's base voltage at a voltage level that is a predetermined value below the VCC voltage (highest positive voltage in circuit).

Additionally, the clamp transistors Q12 and Q13 contribute to setting the quiescent (idle) current when no current is flowing through resistor R10, i.e., there is no differential voltage signal across the input terminals INM and INP. On the positive side of the output stage, a translinear current loop flows through the voltage source V11, transistor Q12 and the output transistor Q10. Similarly, on the negative side, a translinear current loop runs through voltage source V13, transistor Q13 and output transistor Q11.

In one embodiment, the voltage sources V11 and V13 could be implemented with two stacked diodes that are biased at a fixed current to match the base-emitter voltages of the respective clamp transistor Q12 and Q13 and output transistors Q10 and Q11.

To prevent part of the drive current for the active output transistor (Q10 or Q11) from being diverted and drained to a rail of the power supply when a clamp transistor (Q12 or Q13) on the other side of the power supply rail is active, a portion of the current that is used to turn on the clamp transistor is reused to further turn on (drive) the active output transistor. The collector for each clamp transistor is coupled to a base of the output transistor that will reuse the clamp transistor's turn on current; and the emitter of each clamp transistor is coupled to the base of the other output transistor that is turned off and clamped to some predetermined value when the associated clamp transistor is active. The reusing of a clamp transistor's turn on current can reduce sudden jumps in current gain when the clamp transistor becomes active, which can cause non-linear crossover distortion in the output signal of the output stage.

A floating current source is enabled by the arrangement of a PNP transistor Q28 and an NPN transistor Q29 in combination with voltage sources V10 and V12. This arrangement of devices stabilizes the quiescent current and reduces the Early effect on clamp transistors Q12 and Q13 over a range of supply voltages. At one side of the floating current source a current will flow into a current mirror enabled by the arrangement of transistors Q22 and Q23; and at the other side the current will flow from the floating current source into the current mirror created by the arrangement of transistors Q24 and Q25. When base currents are ignored, the amount of current flowing from the floating current source into either of the current mirrors is necessarily equal.

Also, the current flowing from the floating current source is in addition to the currents flowing through the supply terminals of input buffer A1. The supply current from input buffer A1 is mirrored by current flowing through the two current mirrors (transistors Q22/Q23 and Q24/Q25). However, since the supply current from input buffer A2 is equal to that of input buffer A1, all of the mirrored currents associated with input buffer A1 are absorbed by input buffer A2. Thus, current flowing through floating current source transistors Q28 and Q29 represents an excess current that is split into two currents that flow equally through clamp transistors Q12 and Q13. Also, because the Early effect of the current source tracks that of the clamp transistors Q12 and Q13, it can provide a relatively stable quiescent current over a range of supply voltages, e.g., 2.7 Volts to 10 Volts.

Additionally, Early effect compensation for the clamp transistors Q12 and Q13 is provided by the matching and biasing of the floating current source transistors Q28 and Q29 in relation to the clamp transistors. Floating current source transistors Q28 and Q29 are manufactured substantially identical in size and type to clamp transistors Q12 and Q13 and both pairs of transistors are biased at the same voltages, i.e., the collectors and emitters are biased one base-emitter voltage away from the opposite supply voltage rail. Since the Early effect for transistor Q28 is substantially equal to that of transistor Q12 and the Early effect for transistor Q29 is substantially equal to that of transistor Q13, the Early effect is cancelled out (compensated) for interactions between both pairs of transistors over a range of supply voltages.

For example, when the supply voltage increases, the voltage across floating current source transistors Q28 and Q29 increases, which causes the current through the clamp transistors Q12 and Q13 to increase. However, transistors Q12 and Q13, also have an increase in their collector-emitter voltages that is substantially similar to that of the floating current source transistors Q28 and Q29. Because of the higher voltage between the collector and emitter of clamp transistors Q12 and Q13, the Early effect will tend to make their base-emitter voltage smaller to support the same collector currents. This is the Early effect that, if not compensated for, could cause the quiescent current of the output transistors to increase at higher supply voltages. In this case, the collector currents of clamp transistors Q12 and Q13 are not constant, but increase due to the Early effect on the operation of floating current source transistors Q28 and Q29. This increase in the collector currents causes the base-emitter voltages of clamp transistors Q12 and Q13 to increase again, which counteracts (compensates for) the effect of the increased collector-emitter voltages for these transistors. Thus, the Early effect of PNP clamp transistor Q12 is compensated for by the Early effect of PNP floating current source transistor Q28, while the Early effect of NPN clamp transistor Q13 is compensated for by NPN floating current source transistor Q29. Furthermore, since the Early effect compensation is provided by the same type of transistor (NPN—NPN or PNP—PNP), the first order Early effect compensation is relatively exact and not dependent on any process parameter or, for example, temperature.

Figure 4:
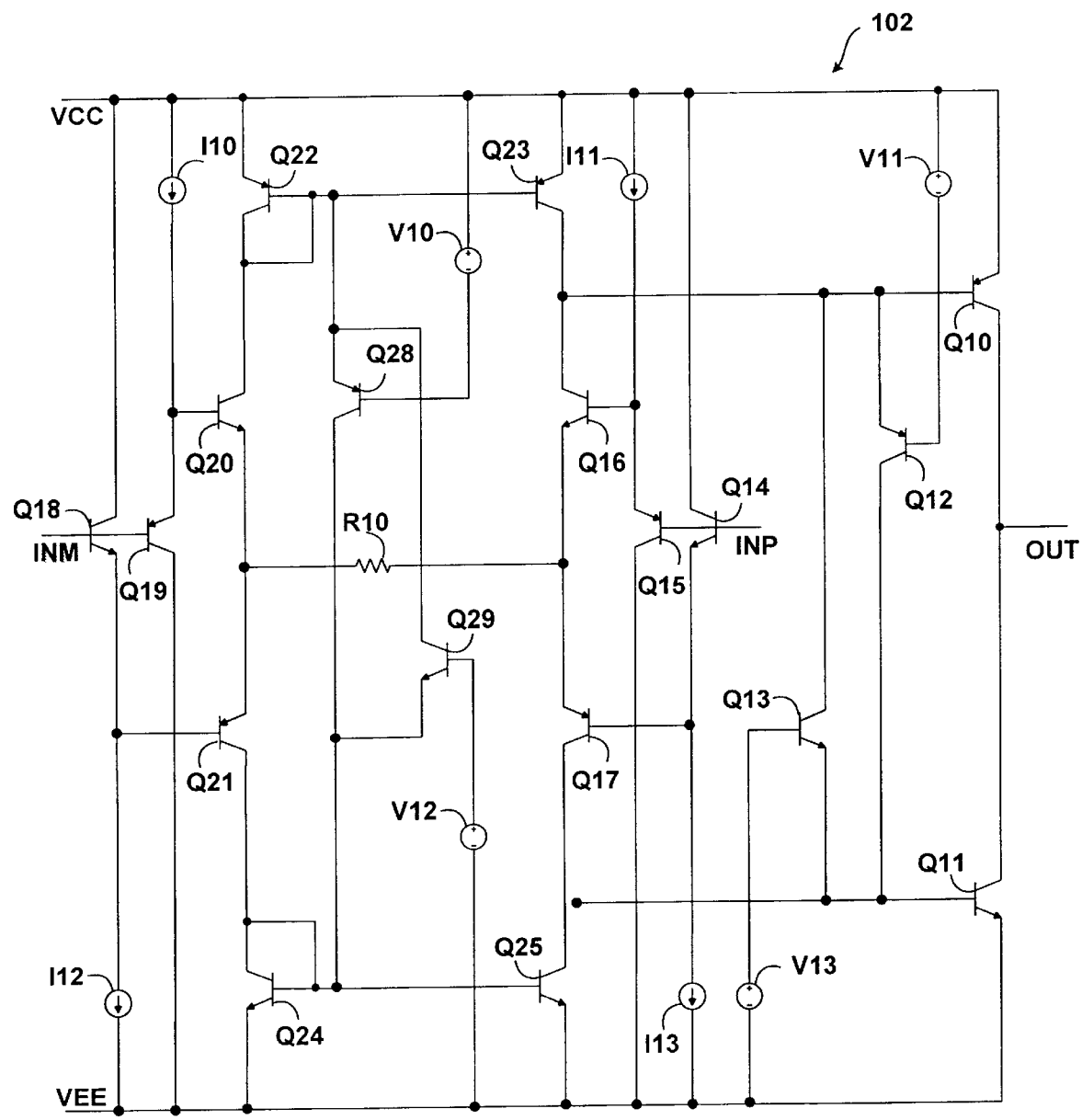
FIG. 4 shows a schematic diagram of another embodiment of the invention with input buffers represented by an arrangement of transistors coupled as emitter followers to the differential input terminals of a Class AB bipolar output stage.

FIG. 4 illustrates a schematic diagram 102 of the output stage shown in FIG. 3, except that the input buffers A1 and A2 are now represented as discrete transistors. In particular, the transistors Q18, Q19, Q20 and Q21 and current sources I10 and I12 are arranged as emitter followers to perform substantially the same function as input buffer A1; and similarly the function of input buffer A2 is performed by the arrangement in emitter followers of transistors Q14, Q15, Q16 and Q17 and current sources I11 and I13.

It is envisioned that the invention may be employed in an output stage for applications other than amplifiers such as a comparator.

Figure 5:
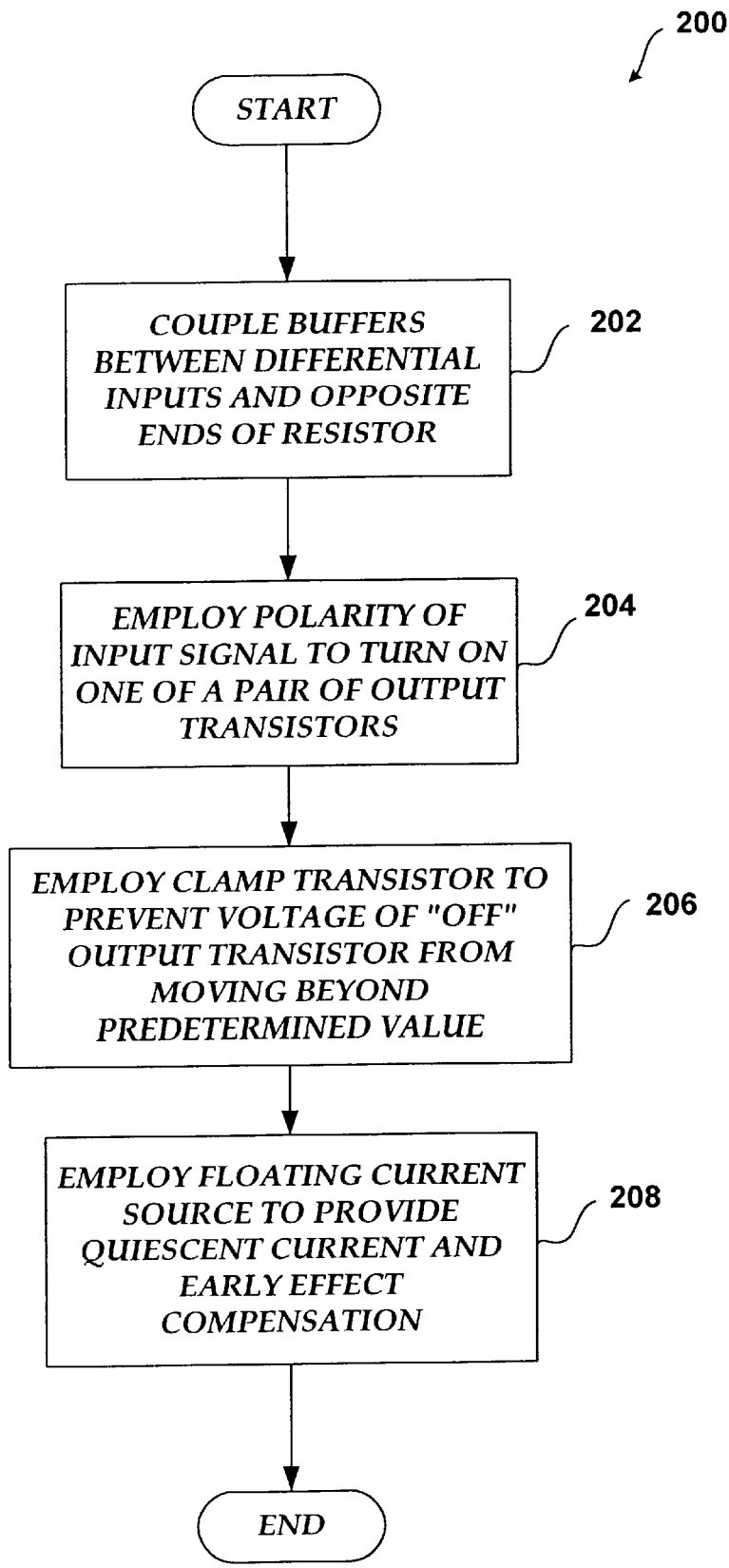
FIG. 5 illustrates a flow chart for converting a differential input into a single ended output with an output stage in accordance with the invention.

FIG. 5 illustrates a flow chart 200 for converting a differential input signal into a single ended output signal for an output stage with a Class AB mode of operation. Moving from a start block to an operation 202, a pair of buffers are provided that have an input separately coupled to one of a pair of input terminals. The output for each buffer is coupled to an opposite end of a resistor and the input terminals are adapted to receive a differential signal.

Advancing to an operation 204, in response to the input signal, one of a pair of output switches is turned on. The output switches are separately coupled between a different side of a supply voltage and a single ended output terminal. Each output switch is a different type and is separately turned on when a polarity of the differential signal matches the type of the output switch.

Flowing to an operation 206, in response to the output signal, a control voltage for each output switch is separately clamped with one of a pair of clamp switches. Each clamp switch is a different type and is associated with one of the output switches that is the same type. When the polarity of the differential signal turns on one of the output switches, a clamp switch turns on and prevents a control voltage for the associated output switch from moving beyond a predetermined value. Each clamp switch is coupled between the control terminals for each output switch.

Moving to an operation 208, a floating current source is enabled with a pair of source switches that are different types and coupled between a pair of current mirrors that are separately coupled to opposite sides of the supply voltage and each buffer. The pair of source switches turn on each current mirror to mirror a current flowing through the resistor in response to the polarity of the differential signal. The size of each source switch is matched to the size of each clamp switch of the same type so that compensation for the Early effect is provided to prevent non-linear operation of the clamp switches over a range of supply voltages. Next, the logic flow advances to an end block and performs other operations.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for an output stage, comprising:
   (a) a pair of buffers, an input for each buffer is separately coupled to one of a pair of input terminals and an output for each buffer is coupled to an opposite end of a resistor, wherein the input terminals are adapted to receive a differential signal;
   (b) a pair of output switches that are separately coupled between a different side of a supply voltage and a single ended output terminal, each output switch is a different type and separately turns on when a polarity of the differential signal matches the type of the output switch;
   (c) a pair of clamp switches, each clamp switch is a different type and is associated with one of the output switches that is the same type, when the polarity of the differential signal turns on one of the output switches, a clamp switch turns on and prevents a control voltage for the associated output switch from moving beyond a predetermined value, wherein each clamp switch is coupled between the control terminals for each output switch; and
   (d) a pair of source switches that are different types and coupled between a pair of current mirrors that are separately coupled to opposite sides of the supply voltage and each buffer, the pair of source switches provide a floating current source that turns on each current mirror to mirror a current flowing through the resistor in response to the polarity of the differential signal, wherein the size of each source switch is matched to the size of each clamp switch of the same type so that compensation for the Early effect is provided to prevent variations in the quiescent current over a range of supply voltages.

2. The apparatus of claim 1, wherein the coupling of each clamp switch between the control terminals of each output transistor causes a reduction in the cross over distortion of an output signal at the single ended output terminal.

3. The apparatus of claim 1, wherein the floating current source further provides a quiescent current that is stable over a range of supply voltages.

4. An apparatus for an output stage that includes bipolar transistors, comprising:
   (a) a pair of buffers, an input for each buffer is separately coupled to one of a pair of input terminals and an output for each buffer is coupled to an opposite end of a resistor, wherein the input terminals are adapted to receive a differential signal;
   (b) a pair of different types of output transistors that are separately coupled between a different side of a supply voltage and a single ended output terminal, each output transistor separately turns on in response to a polarity of the differential signal;
   (c) a pair of different types of clamp transistors that are separately associated with one of the output transistors that is the same type, when the polarity of the differential signal turns on one of the output transistors, a clamp transistor turns on and prevents a turn off voltage at a base of the associated output transistor from moving beyond a predetermined value, wherein a collector and an emitter for each clamp transistor is coupled between the bases of each output transistor; and
   (d) a pair of source transistors that are different types and coupled between a pair of current mirrors that are separately coupled to opposite sides of the supply voltage and each buffer, the pair of source transistors provide a floating current source that turns on each current mirror to mirror a current flowing through the resistor in response to a polarity of the differential signal, wherein the size and type of each source transistor is matched to the size and type of an associated clamp transistor so that variations in the quiescent current caused by the Early effect over a range of supply voltages is automatically compensated for.

5. The apparatus of claim 1, further comprising
   (a) a pair of voltage sources that are separately coupled to a base of each source transistor and separately coupled to separate sides of the supply voltage; and
   (b) another pair of voltage sources that are separately coupled to a base of each clamp transistor and separately coupled to a side of the supply voltage that is coupled to an emitter of the associated output transistor.

6. The apparatus of claim 5, wherein each voltage source further comprises two stacked diodes that are biased at a fixed current to match the base-emitter voltages of the associated clamp transistor and output transistors.

7. The apparatus of claim 4, wherein a coupling of a collector and an emitter for each clamp transistor between the bases of each output transistor causes a reduction in the cross over distortion of an output signal at the single ended output terminal.

8. The apparatus of claim 4, wherein the floating current source further provides a quiescent current that is stable over a range of supply voltages.

9. The apparatus of claim 4, wherein when the polarity of the differential signal turns on an output transistor, the other output transistor is kept at a small idle current; and when another polarity of the differential signal turns on the other output transistor, the output transistor is kept at another small idle current.

10. The apparatus of claim 4, further comprises a base for each clamp transistor that is coupled to a separate voltage source, the separate voltage source is coupled to a side of the supply voltage that is coupled to the emitter of the associated output transistor.

11. The apparatus of claim 4, wherein each current mirror is coupled to an opposite side of the supply voltage.

12. The apparatus of claim 4, wherein the output stage is employed with an electronic circuit, including amplifier and comparator.

13. The apparatus of claim 4, wherein the output stage provides Class AB operation.

14. The apparatus of claim 4, wherein the types of the transistors include NPN and PNP.

15. An apparatus for an output stage, comprising:
   (a) means for providing a pair of buffers, an input for each buffer is separately coupled to one of a pair of input terminals and an output for each buffer is coupled to an opposite end of a resistor, wherein the input terminals are adapted to receive a differential signal;
   (b) means for separately turning on one of a pair of output switches that are separately coupled between a different side of a supply voltage and a single ended output terminal, each output switch is a different type and separately turns on when a polarity of the differential signal matches the type of the output switch;

(c) means for separately clamping a control voltage for each output switch with a pair of clamp switches, each clamp switch is a different type and is associated with one of the output switches that is the same type, when the polarity of the differential signal turns on one of the output switches, a clamp switch turns on and prevents a control voltage for the associated output switch from moving beyond a predetermined value, wherein each clamp switch is coupled between the control terminals for each output switch; and (d) means for providing a floating current source with a pair of source switches that are different types and coupled between a pair of current mirrors that are separately coupled to opposite sides of the supply voltage and each buffer, the pair of source switches enable the floating current source to turn on each current mirror to mirror a current flowing through the resistor in response to the polarity of the differential signal, wherein the size of each source switch is matched to the size of each clamp switch of the same type so that compensation for the Early effect is provided to prevent variations in the quiescent current over a range of supply voltages.

16. The apparatus of claim 15, wherein the coupling of each clamp transistor between the control terminals of each output transistor further provides a means for causing a reduction in the cross over distortion of an output signal at the single ended output terminal.

17. The apparatus of claim 15, wherein the floating current source further provides a means for a quiescent current that is stable over a range of supply voltages.

18. A method for converting a differential input signal into a single ended output signal for an output stage with a Class AB mode of operation, comprising:

(a) providing a pair of buffers, an input for each buffer is separately coupled to one of a pair of input terminals and an output for each buffer is coupled to an opposite end of a resistor, wherein the input terminals are adapted to receive a differential signal;

(b) in response to the input signal, separately turning on one of a pair of output switches that are separately coupled between a different side of a supply voltage and a single ended output terminal, each output switch is a different type and separately turns on when a polarity of the differential signal matches the type of the output switch;

(c) in response to the output signal, separately clamping a control voltage for each output switch with a pair of clamp switches, each clamp switch is a different type and is associated with one of the output switches that is the same type, when the polarity of the differential signal turns on one of the output switches, a clamp switch turns on and prevents a control voltage for the associated output switch from moving beyond a predetermined value, wherein each clamp switch is coupled between the control terminals for each output switch; and (d) providing a floating current source with a pair of source switches that are different types and coupled between a pair of current mirrors that are separately coupled to opposite sides of the supply voltage and each buffer, the pair of source switches enable the floating current source to turn on each current mirror to mirror a current flowing through the resistor in response to the polarity of the differential signal, wherein the size of each source switch is matched to the size of each clamp switch of the same type so that compensation for the Early effect is provided to prevent variations in a quiescent current over a range of supply voltages.

19. The method of claim 18, wherein the coupling of each clamp transistor between the control terminals of each output transistor further provides for causing a reduction in the cross over distortion of an output signal at the single ended output terminal.

20. The method of claim 18, wherein the floating current source further provides for the stability of the quiescent current over a range of supply voltages.

* * * * *

UNITED STATES PATENT AND TRADEMARK OFFICE
CERTIFICATE OF CORRECTION

PATENT NO. : 6,294,958 B1
DATED : September 25, 2001
INVENTOR(S) : Eschauzier

It is certified that error appears in the above-identified patent and that said Letters Patent is hereby corrected as shown below:

Column 4,
Line 15, delete "all"

Column 6,
Line 21, "112" should read -- I12 --

Signed and Sealed this

Twenty-first Day of May, 2002

Attest:

Attesting Officer

JAMES E. ROGAN
Director of the United States Patent and Trademark Office